(12) United States Patent
Chang

(10) Patent No.: US 7,083,676 B2
(45) Date of Patent: Aug. 1, 2006

(54) METHOD OF LASER CRYSTALLIZATION

(75) Inventor: Mao-Yi Chang, Taipei (TW)

(73) Assignee: AU Optronics Corp., Hsin-Chu (TW)

( * ) Notice: Subject to any disclaimer, the term of this patent is extended or adjusted under 35 U.S.C. 154(b) by 154 days.

(21) Appl. No.: 10/249,892

(22) Filed: May 15, 2003

(65) Prior Publication Data

US 2004/0118335 A1 Jun. 24, 2004

(30) Foreign Application Priority Data

Dec. 24, 2002 (TW) .............................. 91137219 A

(51) Int. Cl.
*C30B 13/00* (2006.01)
(52) U.S. Cl. ............................................ 117/3; 117/37
(58) Field of Classification Search ................ 117/3, 117/4, 37, 47, 46, 50
See application file for complete search history.

(56) References Cited

U.S. PATENT DOCUMENTS

| | | | | |
|---|---|---|---|---|
| 4,662,949 A * | 5/1987 | Inoue et al. | .................. | 117/43 |
| 5,382,537 A * | 1/1995 | Noguchi | ................... | 438/162 |
| 5,803,965 A * | 9/1998 | Yoon | ............... | 117/4 |
| 5,932,003 A * | 8/1999 | Naomoto et al. | ............. | 117/44 |
| 6,080,236 A * | 6/2000 | McCulloch et al. | ........... | 117/4 |
| 6,113,689 A * | 9/2000 | Moon | ........................... | 117/43 |
| 6,143,661 A * | 11/2000 | Kousai et al. | .............. | 438/689 |
| 6,176,922 B1 * | 1/2001 | Aklufi et al. | ................... | 117/4 |
| 6,193,796 B1 * | 2/2001 | Yang | ............................. | 117/4 |
| 6,241,817 B1 * | 6/2001 | Jang et al. | ..................... | 117/8 |
| 6,322,625 B1 * | 11/2001 | Im | ................ | 117/43 |
| 6,375,737 B1 * | 4/2002 | Shih et al. | ..................... | 117/3 |
| 6,558,802 B1 * | 5/2003 | Henley et al. | .............. | 428/446 |
| 2003/0000455 A1 * | 1/2003 | Voutsas | ....................... | 117/47 |

FOREIGN PATENT DOCUMENTS

WO   WO 97/45827   * 12/1997

* cited by examiner

*Primary Examiner*—James P. Mackey
(74) *Attorney, Agent, or Firm*—Winston Hsu

(57) ABSTRACT

At least one amorphous silicon island is formed on a substrate first. A first step and a second step laser crystallization processes are thereafter performed in sequence. The amorphous silicon island is irradiated with a laser pulse having a first energy density to re-crystallize an edge portion of the amorphous silicon island into a polysilicon structure. The amorphous silicon island is then irradiated with a laser pulse having a second energy density to re-crystallize a center portion of the amorphous silicon island into a polysilicon structure.

24 Claims, 8 Drawing Sheets

METHOD OF LASER CRYSTALLIZATION

BACKGROUND OF INVENTION

1. Field of the Invention

The present invention relates to a method of laser crystallization (LC), and more particularly, to a method of two-step laser crystallization having an enlarged process window.

2. Description of the Prior Art

Nowadays, a liquid crystal display(LCD)is the most mature flat panel display technique. The applications for a liquid crystal display are extensive, such as mobile phones, digital cameras, video cameras, notebooks, and monitors. Due to the high quality vision requirements and the expansion into new application fields, the LCD has developed toward high quality, high resolution, high brightness, and low price. A low temperature polysilicon thin film transistor (LTPS TFT), having a character of being actively driven, is a break-through in achieving the above objectives. Furthermore, a metal-oxide-semiconductor and the low temperature polysilicon thin film transistor in this technique are integrated in a same manufacturing process to fabricate a system on panel (SOP). The low temperature polysilicon thin film transistor therefore has become a booming development area for all vendors.

During the manufacturing process of the low temperature polysilicon thin film transistor liquid crystal display, a glass substrate tends to deform if the polysilicon film is directly formed at a high temperature since the resistance of the glass substrate to heat is merely up to 600° C. As a result, expensive quartz is utilized as the substrate for the traditional polysilicon thin film transistor liquid crystal display. The application is therefore limited to small sized liquid crystal display panels. Nowadays, a method to re-crystallize the amorphous silicon thin film has become popular and mainstream. More particularly, the excimer laser annealing (ELA) process is most significant.

Please refer to FIG. 1. FIG. 1 is a schematic diagram of a method of forming a polysilicon thin film by utilizing an excimer laser annealing process. As shown in FIG. 1, an amorphous silicon thin film 12 having a thickness of approximately 500 Å is deposited on a glass substrate 10 first. Then the glass substrate 10 is disposed in a hermetic chamber (not shown) to perform the excimer laser annealing process. The method for depositing the amorphous silicon thin film 12 comprises a low-pressure chemical vapor deposition (LPCVD) process, a plasma enhanced chemical vapor deposition (PECVD) process, or a sputtering process. When performing the excimer laser annealing process, the amorphous silicon thin film 12 on the surface of the glass substrate 10 is irradiated by the laser pulse 14 of the excimer laser through a transparent window (not shown) on the upper surface of the chamber (not shown). The laser pulse 14 scans the regions within a process scope, which is determined previously, step-by-step to heat the amorphous silicon thin film 12 within the process scope rapidly. The amorphous silicon thin film 12 is therefore re-crystallized into a polysilicon thin film (not shown).

Moreover, the amorphous silicon thin film is melted and re-crystallized rapidly through absorption of the deep ultraviolet light during the excimer laser annealing process to form the polysilicon thin film. Such a quick absorption due to the short laser pulse only affects the surface of the amorphous silicon thin film and will not affect the glass substrate. Hence, the glass substrate is kept in a low temperature state. The excimer lasers frequently used comprise a XeCl laser, an ArF laser, a KrF laser, and a XeF laser. Since the different molecules will generate light with different wavelengths, the output energy density is therefore adjusted according to the thickness of the amorphous silicon thin film. For example, the output energy density is approximately 200 to 400 mJ/cm$^2$ for an amorphous silicon thin film with a thickness of 500 Å. After performing the excimer laser annealing process, the subsequent processes for forming the liquid crystal display panel are performed. The polysilicon thin film is used as a channel or a source/drain to form the driving circuit or the logic circuit on the liquid crystal display panel.

Since the quality of the amorphous silicon thin film 12 is a determinative factor for the characteristics of the subsequently formed polysilicon thin film, all of the parameters during the amorphous silicon thin film deposition process need to be strictly controlled. The amorphous silicon thin film with low hydrogen content, high thickness uniformity and low surface roughness is thus formed. In addition, many variables during the crystallization process will directly affect the grain size and the grain distribution after the crystallization process is completed. When non-uniform phenomenon occurs during the crystallization process, various types of defects emerge.

Please refer to FIG. 2. FIG. 2 is a schematic diagram of an energy density utilized in the prior art laser crystallization process. As shown in FIG. 2, the energy density E adapted in the prior art laser crystallization process is between a nearly-completely-melted energy density ($E_{NCM}$) and a super lateral growth energy density (SLG energy density, $E_{SLG}$) of the amorphous silicon thin film. When the energy density is lower than the nearly-completely-melted energy density, the seeds are not able to grow as large grains due to the insufficient energy provided to the seeds. The grains formed are thus small. When the energy density is higher than an amorphousization energy density ($E_\alpha$) of the amorphous silicon thin film 12, the amorphous silicon thin film 12 is completely melted and then re-crystallize due to quench. The phenomenon of homogeneous nucleation therefore occurs to generate nucleation sites everywhere. Grains are not able to grow effectively so that the formed grain size is abruptly decreased, or is even amorphourized. When the energy density is between the super lateral growth energy density and the amorphousization energy density of the amorphous silicon thin film 12, small grains are simultaneously formed when large grains are formed. As a result, the grain size uniformity between devices cannot be well controlled to incur discrepancy of electrical performance between devices.

However, the prior art method of laser crystallization faces limitation. Please refer to FIG. 3A and FIG. 3B. FIG. 3A and FIG. 3B are cross-sectional diagrams illustrating amorphous silicon islands 20A, 20B after performing the prior art laser crystallization process. Since a photo-etching-process (PEP, not shown) is usually performed after forming the amorphous silicon thin film 12, in practical operation, to etch the amorphous silicon thin film 12 to amorphous silicon islands 20A, 20B, shown in FIG. 3A and FIG. 3B respectively. The amorphous silicon islands 20A, 20B may have various shapes according to the requirement of design and process. In FIG. 3A and FIG. 3B, an active area of a low temperature polysilicon thin film transistor (not shown), which is frequently seen, is adapted for illustrating.

As shown in FIG. 3A and FIG. 3B, thermal conduction rates of edge portions 22A, 22B of the amorphous silicon islands 20A, 20B are greater than thermal conduction rates of center portions 24A, 24B of the amorphous silicon island 20A, 20B to form temperature gradients due to unequal numbers of heat dissipating directions.

Therefore the amorphous silicon thin film in the edge portions 22A, 22B of the amorphous silicon islands 20A, 20B start to solidify after the amorphous silicon thin film in the edge portions 22A, 22B of the amorphous silicon islands 20A, 20B are nearly completely melted. Residual amorphous silicon seeds (not shown) in the amorphous silicon thin film in the edge portions 22A, 22B of the amorphous silicon islands 20A, 20B then grow laterally toward the center portions 24A, 24B of the amorphous silicon islands 20A, 20B to become large grains 26A, 26B.

However, the lateral growth rate has a specific limitation so that the final grain size is usually 1~2 μm. As shown in FIG. 3A, the large grains 26A can reach to the center of the channel width to improve the electrical performance of device when the channel width is small. Therefore, the prior art method of laser crystallization the amorphous silicon island sometimes adapt the energy density higher than $E_{SLG}$ to enhance the driving ability of lateral growth. As shown in FIG. 3B, the large grains 26B are only formed in the edge portion 22B of the amorphous silicon islands 20B when the channel width is large. Many small grains 28 are formed in the center portion 24B of the amorphous silicon islands 20B to degrade the electrical performance of devices.

Furthermore, the range of the energy density adapted in the prior art laser crystallization process is too small. The laser energy density readily exceeds the above-mentioned range when the laser energy density has a small deviation. In addition, when other variables, such as the spatial uniformity of the laser energy, the overlapping ratio of the laser pulse, the substrate temperature during the laser annealing process and the atmosphere, are not controlled properly, the laser energy density readily exceeds the above-mentioned range too.

Therefore, it is very important to develop a method of laser crystallization so that the lateral growth of different portions of the amorphous silicon island is improved effectively to form homogeneous large grains and to enlarge the process window of the laser crystallization process.

SUMMARY OF INVENTION

It is therefore a primary object of the claimed invention to provide a method of laser crystallization (LC), especially a method of two-step laser crystallization having an enlarged process window.

According to the claimed invention, a substrate is provided first. At least one amorphous silicon island is then formed on the substrate. A first step laser crystallization processes is thereafter performed. The amorphous silicon island is irradiated with a laser pulse having a first energy density to re-crystallize an edge portion of the amorphous silicon island into a polysilicon structure. After that, a second step laser crystallization process is performed. The amorphous silicon island is irradiated with a laser pulse having a second energy density to re-crystallize a center portion of the amorphous silicon island into a polysilicon structure.

The method of laser crystallization according to the claimed invention is to utilize a two-step laser crystallization process to re-crystallize the edge portion of the amorphous silicon island into large grains first, then repair the small grains in the center portion of the amorphous silicon island as normal grains. Even when the amorphous silicon island is applied to devices having large channel width, the problem that grains are not able to reach to the center of the channel width during lateral growth, owing to the limitation of lateral growth rate, is avoided. Therefore, the electrical performance of device is not degraded. In addition, the second step laser crystallization process is utilized to treat the center portion of amorphous silicon island so that the process window of the method of laser crystallization according to the claimed invention is obviously enlarged. As a result, the laser energy density in the present invention method does not readily exceed the spec when the laser energy density has a small deviation and when other variables are not well controlled. When applying the present invention method to a production line, devices having large channels and good electrical performance are fabricated.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
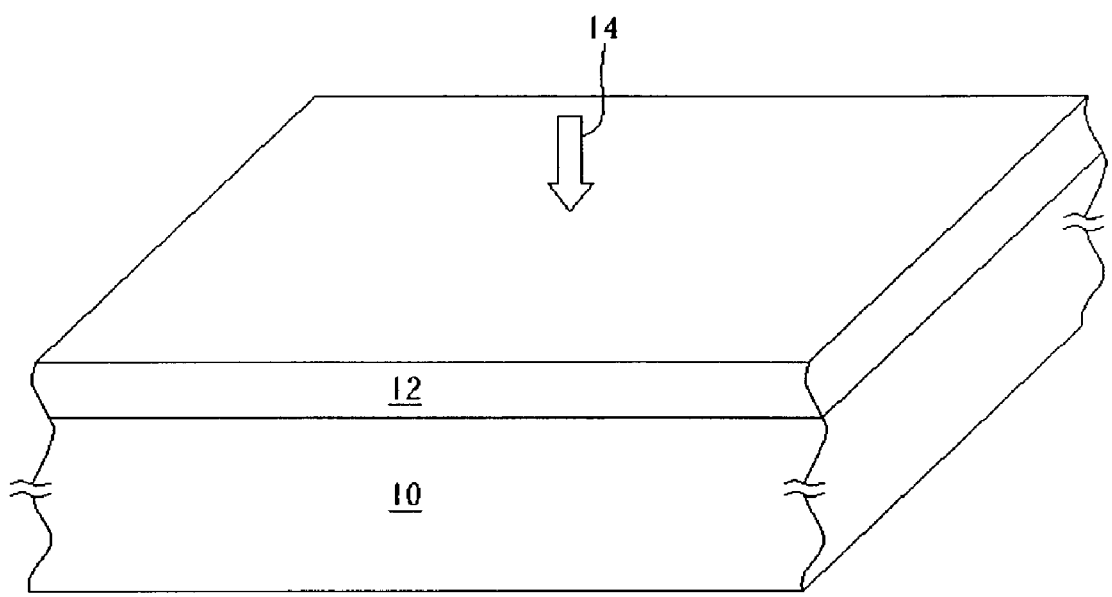
FIG. 1 is a schematic diagram of a method of forming a polysilicon thin film by utilizing an excimer laser annealing process.
Figure 2:
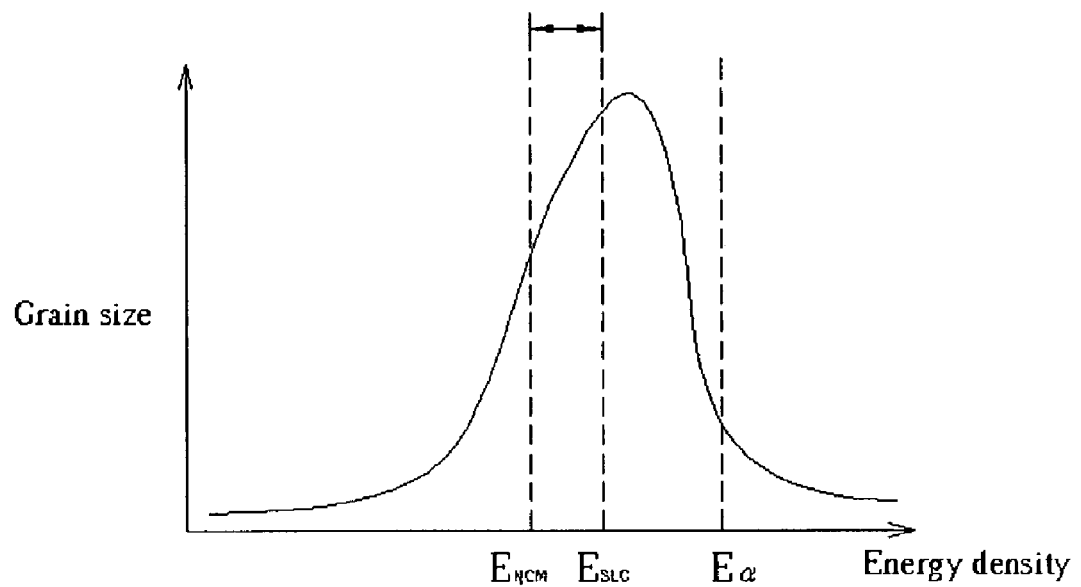
FIG. 2 is a schematic diagram of an energy density utilized in the prior art laser crystallization process.
Figure 3A:
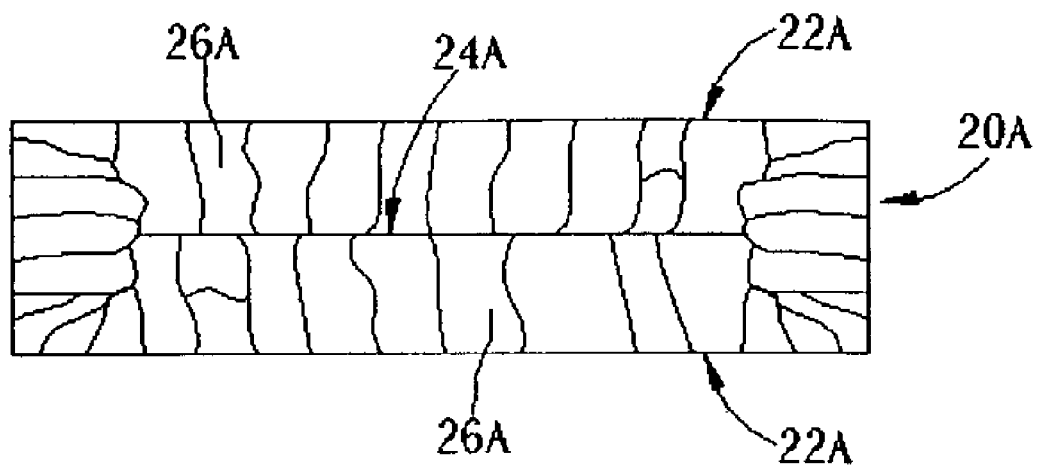
FIG. 3A and FIG. 3B are cross-sectional diagrams illustrating amorphous silicon islands after performing the prior art laser crystallization process.
Figure 3B:
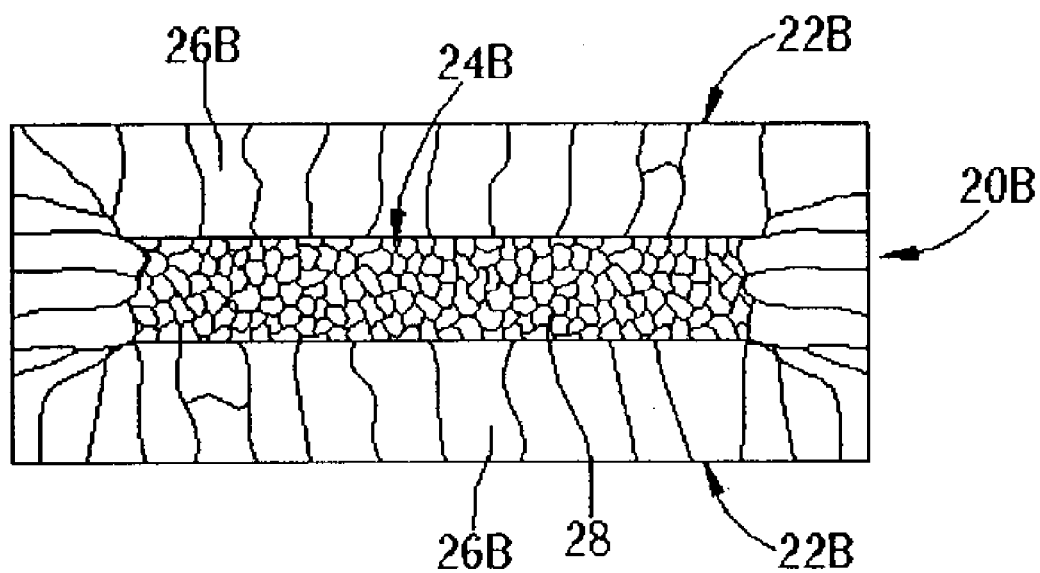
Figure 4:
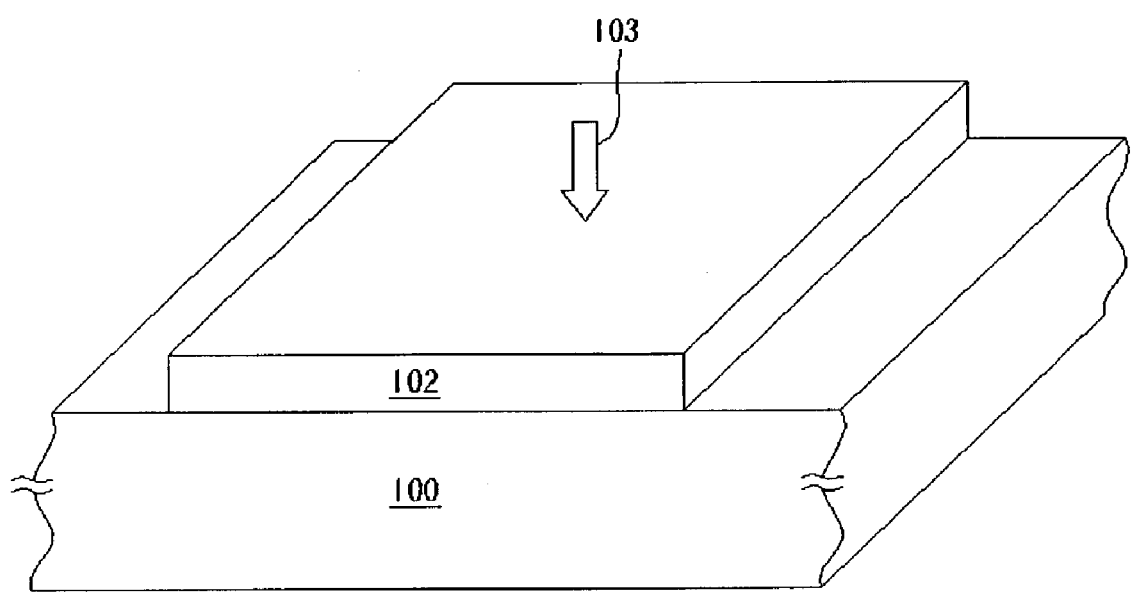
FIG. 4 to FIG. 5 are schematic diagrams of a method of laser crystallization according to the present invention.
Figure 5:
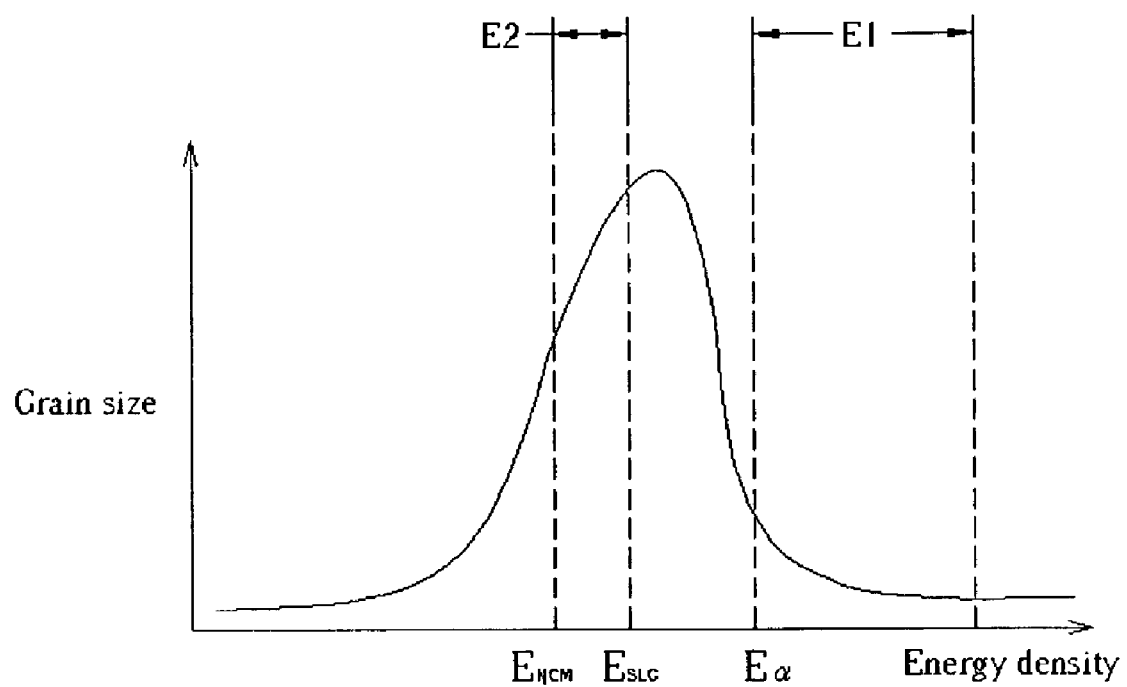
Figure 6A:
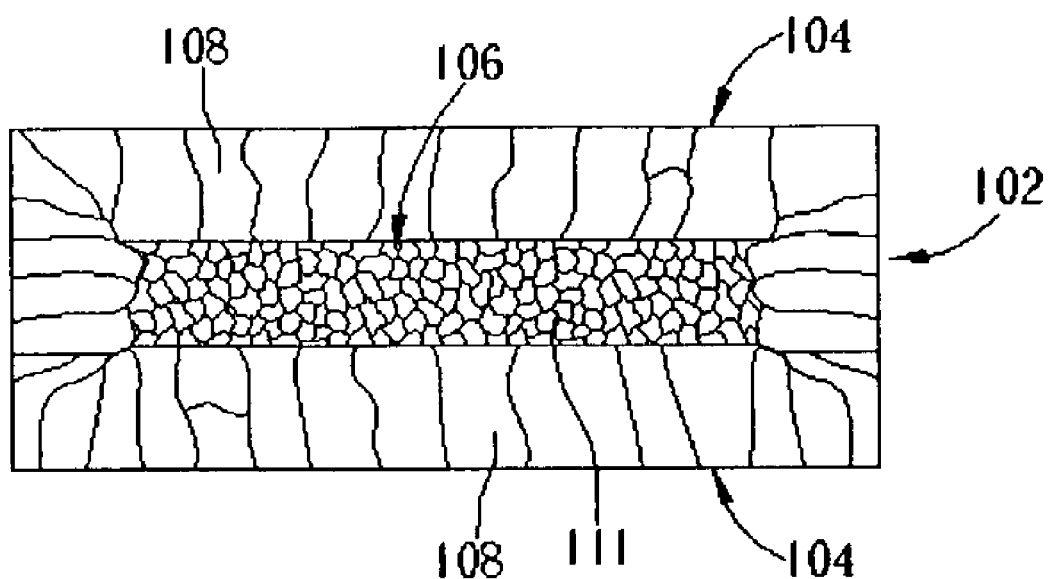
FIG. 6A and FIG. 6B are cross-sectional diagrams illustrating an amorphous silicon island after performing the present invention laser crystallization process.
Figure 6B:
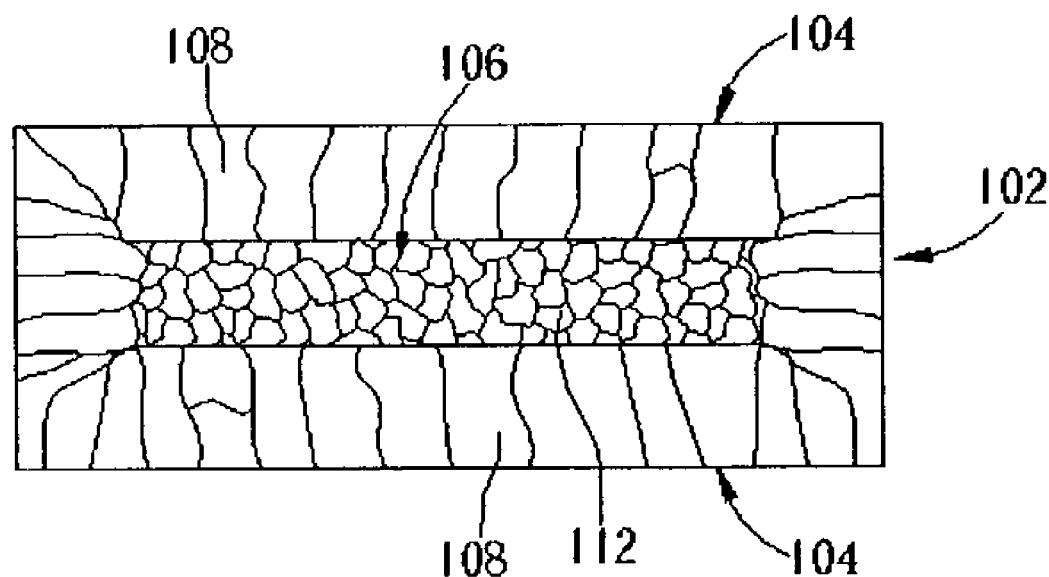

Please refer to FIG. 4 to FIG. 6B. FIG. 4 to FIG. 5 are schematic diagrams of a method of laser crystallization according to the present invention. FIG. 6A and FIG. 6B are cross-sectional diagrams illustrating an amorphous silicon island 102 after performing the present invention laser crystallization process. As shown in FIG. 4, an insulating substrate 100 is provided first. The insulating substrate 100 comprises a glass substrate, a quartz substrate, or a plastic substrate. An amorphous silicon thin film (α-Si thin film, not shown) is then deposited on the insulation substrate 100. A photo-etching-process (PEP) is thereafter performed to etch the amorphous silicon thin film (not shown) to an amorphous silicon island 102. The method for forming the amorphous silicon thin film (not shown) comprises a low pressure chemical vapor deposition (LPCVD) process, a plasma enhanced chemical vapor deposition (PECVD) process, or a sputtering process. The amorphous silicon islands 102 may have various shapes according to the requirement of design and process. In FIG. 4, an active area of a low temperature polysilicon thin film transistor (not shown), which is frequently seen, is adapted for illustrating.

After that, the insulation substrate 100 is disposed in a hermetic chamber (not shown) to perform an excimer laser annealing process. When performing the excimer laser annealing process, the amorphous silicon island 102 on the surface of the insulation substrate 100 is irradiated by the laser pulse 103 of the excimer laser through a transparent window (not shown) on the upper surface of the chamber (not shown). The laser pulse 103 of the excimer laser scans the regions within a process scope, which is determined previously, step-by-step to heat the amorphous silicon island 102 within the process scope rapidly. The excimer laser comprises a XeCl laser, an ArF laser, a KrF laser, or a XeF laser.

The present invention method of laser crystallization utilizes a two-step laser crystallization process to treat the amorphous silicon island 102. As shown in FIG. 5, the first energy density $E_1$ adapted in the first step laser crystallization process is higher than a super lateral growth energy density ($E_{SLG}$) of the amorphous silicon island 102. Actually, the first energy density is preferably higher than an amorphousization energy density ($E_\alpha$) of the amorphous silicon island 102. Because a thermal conduction rate of an edge portion 104 of the amorphous silicon island 102 is greater than a thermal conduction rate of a center portion 106 of the amorphous silicon island 102, a temperature gradient is thus formed when performing the first step laser crystallization process. The edge portion 104 of the amorphous silicon island 102 is solidified after the edge portion 104 of the amorphous silicon island 102 is completely melted, so that at least one seed (not shown) in the edge portion 104 of the amorphous silicon island 102 grows laterally toward the center portion 106 of the amorphous silicon island 102 to re-crystallize into at least one large grain 108, as shown in FIG. 6A.

However, the lateral growth rate has a specific limitation. Hence the final grain size of the large grain 108 is approximately 1~2 µm. At the same time, the center portion 106 of the amorphous silicon island 102 is completely melted and then re-crystallized due to quench. The phenomenon of homogeneous nucleation therefore occurs to generate nucleation sites everywhere in the center portion 106 of the amorphous silicon island 102. Grains are not able to grow effectively so that the formed grain size is abruptly decreased to become many small grains 111, or is even not able to re-crystallize and remains in amorphous silicon structure (not shown).

A second step laser crystallization process is thereafter performed. The second energy density $E_2$ adapted in the second step laser crystallization process is not higher than the super lateral growth energy density of the amorphous silicon island 102. Actually, the second energy density is preferably between a nearly-completely-melted energy density ($E_{NCM}$) of the amorphous silicon island 102 and the super lateral growth energy density of the amorphous silicon island 102.

As shown in FIG. 6B, the center portion 106 of the amorphous silicon island 102 is nearly completely melted and then grows into normal SLG grains 112 (approximately 0.2–0.5 µm in grain size). The already formed large grains 108 in the edge portion 104 of the amorphous silicon island 102 are not affected at all.

After the two-step laser crystallization process, the microstructure of the amorphous silicon island 102 is constituted with the large grains 108 and the normal SLG grains 112 to improve the electrical performance.

Figure 7:
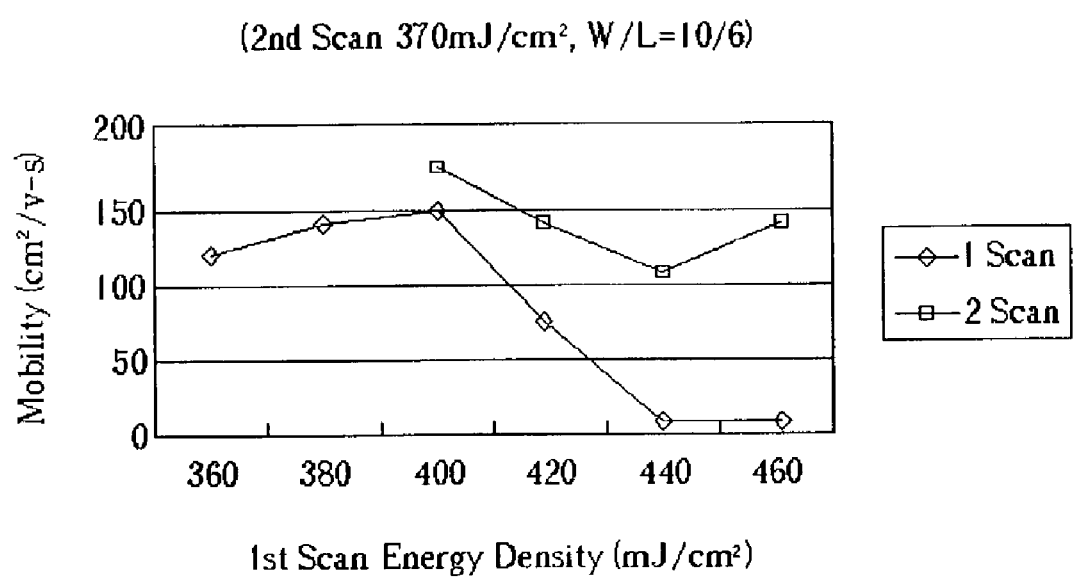
FIG. 7 is a schematic diagram of the mobility of an N-type thin film transistor formed by a method of laser crystallization according to the present invention.
Figure 8:
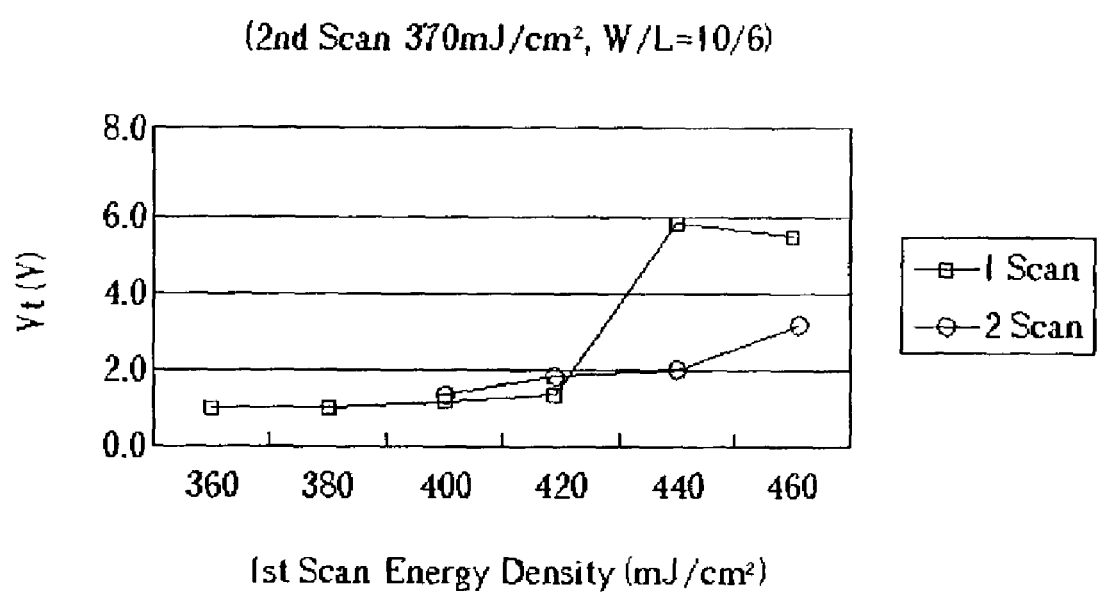
FIG. 8 is a schematic diagram of the threshold voltage of an N-type thin film transistor formed by a method of laser crystallization according to the present invention.

Please refer to FIG. 7 to FIG. 8. FIG. 7 is a schematic diagram of the mobility of an N-type thin film transistor formed by a method of laser crystallization according to the present invention. FIG. 8 is a schematic diagram of the threshold voltage of an N-type thin film transistor formed by a method of laser crystallization according to the present invention. As shown in FIG. 7 and FIG. 8, both the mobility of electrons in the channel and the threshold voltage of the N-type thin film transistor are much improved after the two-step laser crystallization process. When the first step laser crystallization process is performed at a high energy density, the improvement is even more obvious.

The method of laser crystallization according to the present invention is to utilize a two-step laser crystallization process so as to re-crystallize the edge portion and the center portion of the amorphous silicon island into large grains separately. Therefore, the problem that grains are not able to reach to the center of the channel width in the prior art method, incurred from the different heat dissipation rates of the edge portion and the center portion of the amorphous silicon island and the limitation of lateral growth rate, is avoided. Moreover, the second step laser crystallization process is utilized to treat the center portion of amorphous silicon island so that the process window of the method of laser crystallization according to the present invention is obviously enlarged. In addition, the laser energy density in the present invention method does not readily exceed the spec when the laser energy density has a small deviation and when other variables are not well controlled. When applying the present invention method to a production line, devices having large channels and good electrical performance are fabricated.

In comparison with the prior art method of laser crystallization, the present invention method utilizes a two-step laser crystallization process to re-crystallize the edge portion of the amorphous silicon island into large grains first, then repairs the small grains in the center portion of the amorphous silicon island as normal grains. Even when the amorphous silicon island is applied to devices having large channel width, the problem that grains are not able to reach to the center of the channel width during lateral growth, owing to the limitation of lateral growth rate, is avoided. The electrical performance of device is not degraded. Furthermore, the second step laser crystallization process is utilized to treat the center portion of amorphous silicon island so that the process window of the method of laser crystallization according to the present invention is obviously enlarged. The laser energy density in the present invention method does not readily exceed the spec when the laser energy density has a small deviation. Relatively speaking, the laser energy density in the present invention method does not readily exceed the spec when other variables are not well controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of laser crystallization (LC) comprising the steps of:
   providing a substrate;
   forming at least one amorphous silicon island (α-Si island) on a surface of the substrate;
   performing a first step laser crystallization process by irradiating the amorphous silicon island with a laser pulse having a first front-side energy density to re-crystallize an edge portion of the amorphous silicon island into a lateral growth polysilicon structure; and
   performing a second step laser crystallization process by irradiating the amorphous silicon island with a laser pulse having a second front-side energy density to re-crystallize a center portion of the amorphous silicon island into a polysilicon structure, the second front-side energy density being different from the first front-side energy density.

2. The method of claim 1 wherein the substrate comprises a glass substrate, a quartz substrate, or a plastic substrate.

3. The method of claim 1 wherein forming the amorphous silicon island comprises the following steps:
   forming an amorphous silicon thin film (α-Si thin film) on the surface of the substrate; and
   performing a photo-etching-process (PEP) to etch the amorphous silicon thin film to the amorphous silicon island.

4. The method of claim 3 wherein the method of forming the amorphous silicon thin film comprises a low pressure chemical vapor deposition (LPCVD) process, a plasma enhanced chemical vapor deposition (PECVD) process, or a sputtering process.

5. The method of claim 1 wherein the laser is an excimer laser (EL).

6. The method of claim 5 wherein the excimer laser comprises a XeCl laser, an ArF laser, a KrF laser, or a XeF laser.

7. The method of claim 1 wherein a thermal conduction rate of the edge portion of the amorphous silicon island is greater than a thermal conduction rate of the center portion of the amorphous silicon island to form a temperature gradient when performing the first step laser crystallization process and the second step laser crystallization process.

8. The method of claim 7 wherein the first step laser crystallization process is used to solidify the edge portion of the amorphous silicon island after the edge portion of the amorphous silicon island is completely melted so that at least one seed in the edge portion of the amorphous silicon island grows laterally toward the center portion of the amorphous silicon island to become at least one large grain.

9. The method of claim 7 wherein the first step laser crystallization process is used to homogeneously nucleate the center portion of the amorphous silicon island after the center portion of the amorphous silicon island is completely melted so that the center portion of the amorphous silicon island is not able to re-crystallize and remains in amorphous silicon structure.

10. The method of claim 9 wherein the second step laser crystallization process is used to nearly completely melt the center portion of the amorphous silicon island so that the center portion of the amorphous silicon island grows into normal grains.

11. The method of claim 1 wherein the second step laser crystallization process is utilized to enlarge a process window of the first step laser crystallization process.

12. The method of claim 1 wherein the first energy density is higher than a super lateral growth energy density ($E_{SLG}$) of the amorphous silicon island, and the second energy density is not higher than the super lateral growth energy density of the amorphous silicon island.

13. The method of claim 12 wherein the first energy density is higher than an amorphousization energy density ($E_\alpha$) of the amorphous silicon island.

14. The method of claim 12 wherein the second energy density is higher than a nearly-completely-melted energy ($E_{NCM}$) of the amorphous silicon island.

15. A laser crystallization process (LC process) comprising the steps of:
   providing a substrate,
   forming an amorphous silicon thin film (α-Si thin film) on a surface of the substrate;
   performing a photo-etching-process (PEP) to etch the amorphous silicon thin film to at least one amorphous silicon island (α-Si island);
   performing a first step laser crystallization process by irradiating the amorphous silicon island with a laser pulse having a first energy density, the first front-side energy density being higher than an amorphousization energy density ($E_\alpha$) of the amorphous silicon island; and
   performing a second step laser crystallization process by irradiating the amorphous silicon island with a laser pulse having a second front-side energy density between a nearly-completely-melted energy density ($E_{NCM}$) and a super lateral growth energy density ($E_{SLG}$) of the amorphous silicon island.

16. The process of claim 15 wherein the substrate comprises a glass substrate, a quartz substrate, or a plastic substrate.

17. The process of claim 15 wherein forming the amorphous silicon thin film comprises a low pressure chemical vapor deposition (LPCVD) process, a plasma enhanced chemical vapor deposition (PECVD) process, or a sputtering process.

18. The process of claim 15 wherein the laser is an excimer laser (EL).

19. The process of claim 18 wherein the excimer laser comprises a XeCl laser, an ArF laser, a KrF laser, or a XeF laser.

20. The process of claim 15 wherein a thermal conduction rate of an edge portion of the amorphous silicon island is greater than a thermal conduction rate of a region outside the edge portion of the amorphous silicon island to form a temperature gradient when performing the first step laser crystallization process and the second step laser crystallization process.

21. The process of claim 20 wherein the first step laser crystallization process is used to solidify the edge portion of the amorphous silicon island after the edge portion of the amorphous silicon island is completely melted so that at least one seed in the edge portion of the amorphous silicon island grows laterally toward the region outside the edge portion of the amorphous silicon island to re-crystallize into at least one large polysilicon grain.

22. The process of claim 20 wherein the first step laser crystallization process is used to homogeneously nucleate the region outside the edge portion of the amorphous silicon island after the region outside the edge portion of the amorphous silicon island is completely melted so that the region outside the edge portion of the amorphous silicon island is not able to re-crystallize and remains in amorphous silicon structure.

23. The process of claim 22 wherein the second step laser crystallization process is used to nearly completely melt the region outside the edge portion of the amorphous silicon island so that the region outside the edge portion of the amorphous silicon island grows into normal grains.

24. The process of claim 15 wherein the second step laser crystallization process is utilized to enlarge a process window of the first step laser crystallization process.

* * * * *